US010948635B2

(12) United States Patent
Tan

(10) Patent No.: US 10,948,635 B2
(45) Date of Patent: Mar. 16, 2021

(54) LIGHT DIRECTION CONTROL FILM, METHOD FOR MANUFACTURING THE SAME AND FINGERPRINT RECOGNITION PANEL

(71) Applicant: BOE Technology Group Co., Ltd., Beijing (CN)

(72) Inventor: Jifeng Tan, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 81 days.

(21) Appl. No.: 16/202,275

(22) Filed: Nov. 28, 2018

(65) Prior Publication Data
US 2019/0187344 A1 Jun. 20, 2019

(30) Foreign Application Priority Data
Dec. 15, 2017 (CN) .......................... 201711350193.3

(51) Int. Cl.
H01L 27/146 (2006.01)
G06K 9/00 (2006.01)
G02B 5/08 (2006.01)
G02B 1/04 (2006.01)
G02B 1/14 (2015.01)
H01L 27/32 (2006.01)

(52) U.S. Cl.
CPC ............ G02B 5/0883 (2013.01); G02B 1/04 (2013.01); G02B 1/14 (2015.01); G06K 9/0004 (2013.01); H01L 27/1463 (2013.01); H01L 27/14623 (2013.01); H01L 27/14625 (2013.01); H01L 27/14678 (2013.01); H01L 27/14685 (2013.01); H01L 27/3227 (2013.01)

(58) Field of Classification Search
CPC .......... H01L 27/3227; H01L 27/14678; H01L 27/14623; H01L 27/1463; H01L 27/14685; H01L 27/14625; G06K 9/0004; G02B 1/14; G02B 5/0883; G02B 1/04
See application file for complete search history.

(56) References Cited

U.S. PATENT DOCUMENTS

| 7,364,931 | B2 * | 4/2008 | Ito | G06K 9/0002 438/48 |
| 2009/0246642 | A1 * | 10/2009 | Martin | G03F 7/027 430/2 |
| 2013/0203146 | A1 * | 8/2013 | Ying | A61L 27/54 435/177 |
| 2015/0268394 | A1 * | 9/2015 | Uchiyama | G02B 3/0087 359/653 |
| 2017/0351898 | A1 * | 12/2017 | Zhang | G06K 9/2036 |

(Continued)

FOREIGN PATENT DOCUMENTS

JP 8-262263 A * 11/1996 ............... G02B 6/00

Primary Examiner — Savitri Mulpuri
(74) Attorney, Agent, or Firm — Nath, Goldberg & Meyer; Joshua B. Goldberg

(57) ABSTRACT

A light direction control film is provided. The light direction control film has, in a direction perpendicular to a thickness direction of the light direction control film, a refractive index decreasing from a central region of the light direction control film to each of both sides of the light direction control film gradually. A method for manufacturing a light direction control film and a fingerprint recognition panel including the light direction control film are further provided.

15 Claims, 2 Drawing Sheets

(56) References Cited

U.S. PATENT DOCUMENTS

| | | | |
|---|---|---|---|
| 2019/0012510 A1* | 1/2019 | Xu | G06K 9/0004 |
| 2019/0286871 A1* | 9/2019 | Song | G06K 9/2027 |
| 2020/0074138 A1* | 3/2020 | Sun | H01L 27/3225 |
| 2020/0082194 A1* | 3/2020 | Song | G02B 5/0289 |

* cited by examiner

LIGHT DIRECTION CONTROL FILM, METHOD FOR MANUFACTURING THE SAME AND FINGERPRINT RECOGNITION PANEL

CROSS-REFERENCE TO RELATED APPLICATIONS

The present application claims the priority of Chinese Patent Application No. 201711350193.3, filed on Dec. 15, 2017, the contents of which are incorporated herein in their entirety by reference.

TECHNICAL FIELD

The present disclosure relates to the field of fingerprint recognition device, and in particular, relates to a light direction control film, a method for manufacturing the same, and a fingerprint recognition panel including the light direction control film.

BACKGROUND

As people's requirements on privacy are getting higher and higher, the fingerprint recognition technology has been applied in various fields. For example, a fingerprint recognition unit may be provided in a display device, and a user may input his fingerprint to the display device after the display device is booted up. In a case where the input fingerprint of the user is inconsistent with a fingerprint stored in the display device in advance, the user will be denied to use the functions provided by the display device. Further, a fingerprint recognition unit may also be applied to other safety protection system, such as an entrance guard, a safe, or the like.

SUMMARY

Embodiments of the present disclosure provide a light direction control film, a method for manufacturing the same, and a fingerprint recognition panel including the light direction control film.

Some embodiments of the present disclosure provide a light direction control film. The light direction control film has, in a direction perpendicular to a thickness direction of the light direction control film, a refractive index decreasing from a central region of the light direction control film to each of both sides of the light direction control film gradually.

In an embodiment, a distribution of the refractive index of the light direction control film is mirror symmetrical with respect to the central region.

In an embodiment, the refractive index of the light direction control film is uniform in the thickness direction of the light direction control film.

In an embodiment, the light direction control film has a width ranging from 1 µm to 100 µm.

In an embodiment, the light direction control film is made of a photopolymer.

Some embodiments of the present disclosure provide a fingerprint recognition panel, including:
a substrate;
a light sensor provided on the substrate; and
any one of the above light direction control films;
wherein the light sensor is provided between the light direction control film and the substrate, and an orthographic projection of the light sensor on the substrate is located within an orthographic projection of the light direction control film on the substrate.

In an embodiment, the orthographic projection of the light sensor on the substrate completely coincide with the orthographic projection of the light direction control film on the substrate.

In an embodiment, the fingerprint recognition panel further includes a plurality of pixel units and a light blocking region surrounding each of the plurality of pixel units, wherein the light sensor is provided in the light blocking region.

In an embodiment, a light emitting unit is provided in each of the plurality of pixel units, a pixel define layer is provided in the light blocking region, and the light sensor is provided on the pixel define layer.

In an embodiment, the light emitting unit is an organic light emitting diode.

In an embodiment, the fingerprint recognition panel further includes a protection layer provided on a surface of the light direction control film distal to the substrate.

In an embodiment, the fingerprint recognition panel further includes a plurality of pixel units, wherein each of the plurality of pixel units is provided therein with a light emitting unit and one light sensor, and the light sensor and the light emitting unit in each of the plurality of pixel units are provided in a same layer.

In an embodiment, the light sensor and the light emitting unit corresponding to the light sensor are configured to have a same area.

In an embodiment, the fingerprint recognition panel further includes a light uniformly transmissive film, wherein the light uniformly transmissive film and the light direction control film are provided in a same layer.

In an embodiment, the light uniformly transmissive film has a refractive index equal to a refractive index of an edge region, which has a minimum refractive index, of the light direction control film.

In an embodiment, an upper surface of the light uniformly transmissive film is flush with an upper surface of the light direction control film.

Some embodiments of the present disclosure provide a method for manufacturing a light direction control film, the method including steps of:
providing a photopolymer layer; and
exposing the photopolymer layer with ultraviolet light through a mask such that the photopolymer layer undergoes polymerization under irradiation of the ultraviolet light to form the light direction control film;
wherein the mask has, in a widthwise direction thereof, a light transmittance decreasing from each of both sides of the mask to a central region of the mask gradually, such that the light direction control film has, in a direction perpendicular to a thickness direction of the light direction control film, a refractive index decreasing from a central region of the light direction control film to each of both sides of the light direction control film gradually.

In an embodiment, the refractive index of the light direction control film is uniform in the thickness direction of the light direction control film.

In an embodiment, the light direction control film has a width ranging from 1 µm to 100 µm.

BRIEF DESCRIPTION OF THE DRAWINGS

The accompanying drawings, which are provided for better understanding of the present disclosure and constitute a part of the specification, are for the purpose of explaining the present disclosure together with the following specific embodiments, but are not intended to limit the present disclosure. In the drawings.

DETAILED DESCRIPTION

Specific embodiments of the present disclosure will be described in detail below with reference to the accompanying drawings. It should be noted that the embodiments described herein are merely for the purpose of describing and explaining the present disclosure, but are not intended to limit the scope of the present disclosure.

An existing fingerprint recognition unit collects a fingerprint using a method such as an optical collection method, a capacitive collection method, an ultrasonic imaging collection method, or the like. The optical collection method has been widely adopted due to its advantages of wide recognition range, low cost, and the like.

During recognition of a fingerprint of a finger, the finger is pressed on a surface (e.g., a light exit surface) of a fingerprint recognition unit, and light exiting from the fingerprint recognition unit is irradiated on the fingerprint. The fingerprint reflects the light irradiated thereon back into the fingerprint recognition unit. The fingerprint recognition unit receives the light reflected by the fingerprint, obtains the intensity of the reflected light, and recognizes the fingerprint according to the intensity. However, the inventors of the present disclosure have found that a difference between the intensity of light reflected by a valley of the finger and the intensity of light reflected by a ridge of the fingerprint is relatively small, making it difficult to recognize the fingerprint accurately in some cases. Further, light reflected at one position of the fingerprint and light reflected at another position of the fingerprint may interfere with each other, and thus it may be difficult to accurately recognize the fingerprint.

Therefore, how to accurately recognize a fingerprint has become a technical problem to be solved urgently in the art.

As an aspect of the present disclosure, there is provided a light direction control film. The light direction control film has, in a direction (e.g., the horizontal direction as shown in FIGS. 1 and 3, which is also referred to as a widthwise direction hereinafter) perpendicular to a thickness direction (e.g., the vertical direction as shown in FIGS. 1 and 3) of the light direction control film, a refractive index decreasing from a central region (e.g., a geometrical central region) of the light direction control film to each of both sides of the light direction control film gradually (i.e., region by region).

It should be noted that, the refractive index of the light direction control film in the thickness direction is uniform (i.e., constant).

Figure 1:
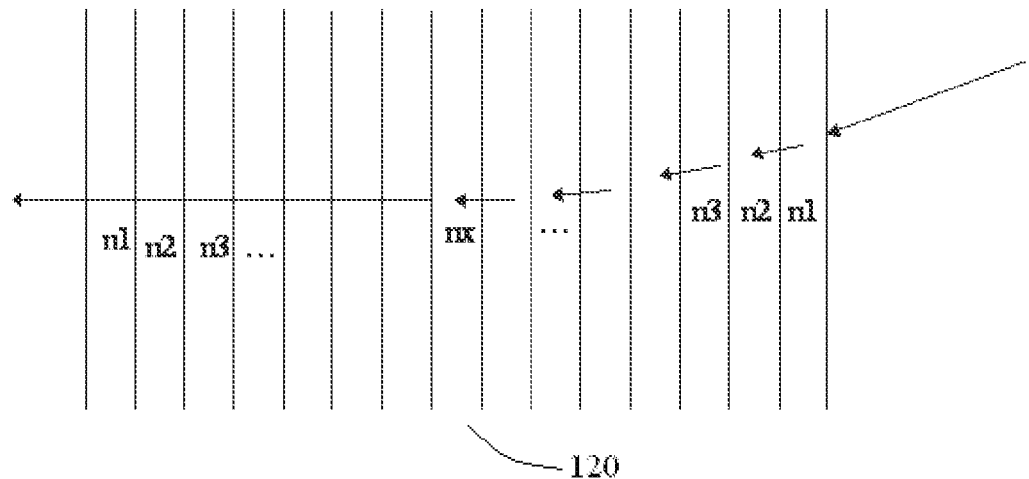
FIG. 1 is a schematic diagram showing a path of light propagating in refractive index gradient regions of a light direction control film, in a case where light is incident on a side in a widthwise direction of the light direction control film, according to an embodiment of the present disclosure.

In an embodiment, as shown in FIG. 1, the light direction control film 120 may include 2×(x−1)+1 regions (which may also be referred to as refractive index gradient regions) in the widthwise direction of the light direction control film 120, where x is a positive integer greater than 1. In the widthwise direction, from each of the two edge regions of the light direction control film 120 to the central region of the light direction control film 120, the refractive index of the light direction control film 120 has values of n1, n2, n3, . . . , nx, and n1<n2<n3< . . . <nx. In other words, the central region of the light direction control film 120 has the maximum refractive index of nx, and each of the two edge regions of the light direction control film 120 has the minimum refractive index of n1. In one embodiment, a distribution of the refractive index of the light direction control film 120 may be mirror symmetrical with respect to the central region (i.e., the region having the refractive index of nx) of the light direction control film 120, as shown in FIG. 1.

Figure 2:
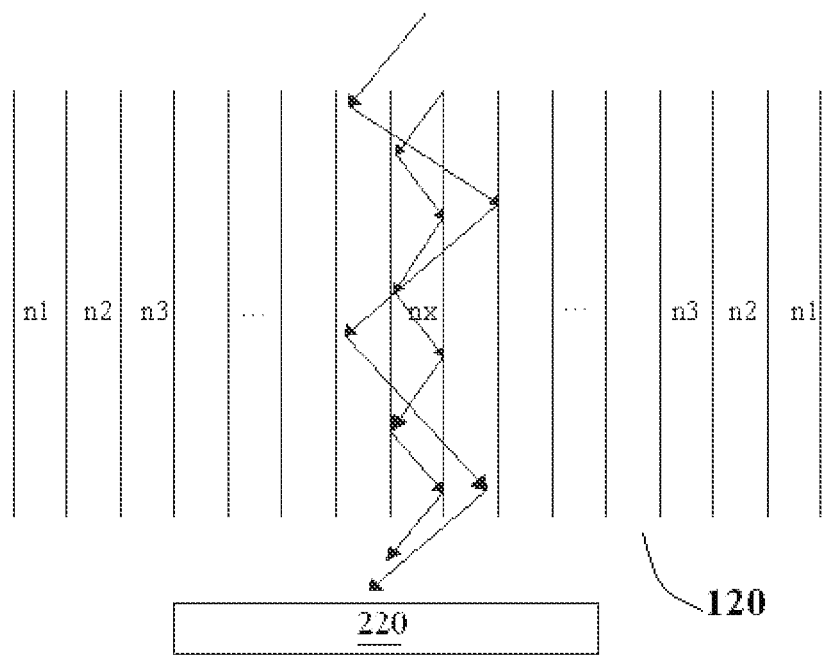
FIG. 2 is a schematic diagram showing a path of light propagating in refractive index gradient regions of a light direction control film, in a case where light is incident on a side in a thickness direction of the light direction control film, according to an embodiment of the present disclosure.
Figure 3:
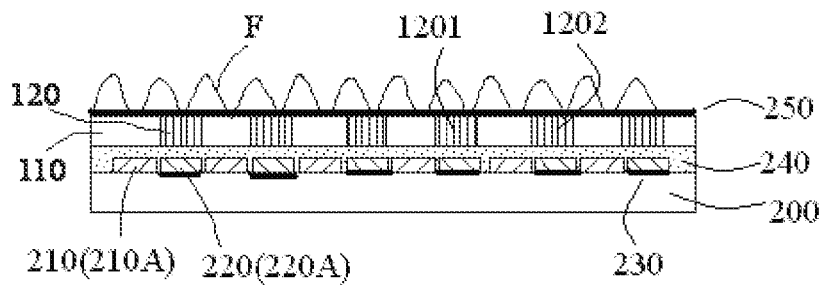
FIG. 3 is a schematic diagram showing a fingerprint recognition panel according to an embodiment of the present disclosure.

As shown in FIG. 3, in a practical application, a plurality of light direction control films 120 may be arranged side by side. The top of a first light direction control film 1201 may correspond to a first portion of a fingerprint F, and the top of a second light direction control film 1202 may correspond to a second portion of the fingerprint F. In a case where a fingerprint recognition panel operates normally and the finger recognition panel is touched by a finger, light exiting from the fingerprint recognition panel will by reflected by the fingerprint F of the finger back into the fingerprint recognition panel. A part of the light reflected by the first portion of the fingerprint F may be incident on the top of (or right above and into) the first light direction control film 1201, as shown in FIG. 2; and another part of the light reflected by the first portion of the fingerprint F may be incident on a side of the second light direction control film 1202, as shown in FIG. 1. Similarly, a part of the light reflected by the second portion of the fingerprint F may be incident on the top of (or right above and into) the second light direction control film 1202, as shown in FIG. 2; and another part of the light reflected by the second portion of the fingerprint F may be incident on a side of the first light direction control film 1201, as shown in FIG. 1. Referring to FIG. 1, when light is incident on the side of the light direction control film 120 (as indicated by the solid arrow in FIG. 1), it first enters into the edge region of the light direction control film 120. Since the refractive index of the light direction control film 120 increases (i.e., changes) from the edge region of the light direction control film 120 to the central region of the light direction control film 120 gradually, the light incident on the side of the light direction control film 120 will be irradiated on an interface between adjacent regions, which have different refractive indexes, of the light direction control film 120, and thus changing its propagation direction. As described above, the refractive index of the central region of the light direction control film 120 is larger than the refractive index of the edge region of the light direction control film 120, and thus the propagation direction of light incident on the side of the light direction control film 120 deflects towards the direction perpendicular to the thickness direction of the light direction control film 120. When the refracted light has a direction perpendicular to the thickness direction of the light direction control film 120, even if the refracted light is irradiated on an interface between adjacent regions having different refractive indexes, the refracted light will not change its propagation direction and keeps propagating along the direction perpendicular to the thickness direction of the light direction control film 120 until it exits from the light direction control film 120, as shown in FIG. 1. In a case where the light emitted from the central region having the maximum refractive index of nx does not deflect into the direction perpendicular to the thickness direction of the light direction control film 120, the light will finally exit from a lower portion of the other side (e.g., the left side shown in FIG. 1) of the light direction control film 120, thereby reducing or avoiding interference of light reflected by portions other than the right above portion of the fingerprint F. Therefore, mutual interference between the light reflected by one position of the fingerprint and the light reflected by another position of the fingerprint can be reduced or avoided, thereby recognizing the fingerprint accurately.

FIG. 2 schematically shows propagation of light after the light reflected by the portion of the fingerprint F located right above one of the light direction control films 120 is incident right above and into the light direction control film 120 (e.g., incident right above and into the central region having the maximum refractive index of nx).

Since the reflected light is incident right above and into the central region having the maximum refractive index of nx, and the refractive index of each of the regions located on both sides of the central region is smaller than the refractive index of nx, in a case where the light is incident on an interface between two adjacent regions, which have different refractive indexes, among the refractive index gradient regions and the incident angle thereof is greater than or equal to a corresponding critical angle of total internal reflection, the light will undergo total internal reflection. After undergoing multiple reflections, the light will exit right below the central region and propagate to a light sensor 220 provided thereunder (as shown in FIG. 2), and a direction in which the light exits may be parallel to a direction of the incident light. In this case, although the light undergoes multiple reflections, the information carried by the light may be unchanged. It can be seen from the present disclosure that, the light reflected by the portion of the fingerprint F located right above one of the light direction control films 120 may be incident almost completely on the light sensor 220 provided right under the light direction control film 120 (as shown in FIG. 2) by total internal reflection. Thus, a difference between the intensity of light reflected by a valley of the fingerprint F and the intensity of light reflected by a ridge of the fingerprint F may be increased, such that the fingerprint can be recognized accurately.

As described above, the light direction control film 120 provided by the present disclosure can be applied to a fingerprint recognition panel to reduce or eliminate the influence of light reflected by different portions of the fingerprint F on a recognition result. An arrangement of the light direction control film 120 in a fingerprint recognition panel will be described in detail below.

In the present disclosure, there is no special limitation on the thickness of the light direction control film 120. In an embodiment, the light direction control film 120 has a thickness ranging from 1 μm to 100 μm. The light direction control film 120 having a thickness within this range is easily manufactured, and can ensure its refractive index remains unchanged in the thickness direction of the light direction control film 120. In the present disclosure, there is also no special limitations on the material of the light direction control film 120. In an embodiment, the light direction control film 120 may be formed by attaching a plurality of transparent film strips having different refractive indexes together. For ease of manufacture, in an embodiment, the light direction control film 120 is made of a photopolymer (e.g., a transparent photopolymer). The formation of the light direction control film 120 by using a photopolymer will be described in detail below.

As another aspect of the present disclosure, there is provided a fingerprint recognition panel, as shown in FIG. 3. The fingerprint recognition panel includes a substrate 200 and at least one light sensor 220 provided on the substrate 200. In an embodiment, the fingerprint recognition panel further includes at least one light direction control film 120 provided in one-to-one correspondence with the at least one light sensor 220, and each of the at least one light direction control film 120 is the light direction control film 120 provided by the present disclosure. As shown in FIG. 3, each light sensor 220 is provided between the corresponding light direction control film 120 and the substrate 200, and an orthographic projection of each light sensor 220 on the substrate 200 is located within an orthographic projection of the corresponding light direction control film 120 on the substrate 200.

When a fingerprint is recognized by the fingerprint recognition panel, the fingerprint F contacts a surface (e.g., a light exit surface) of the fingerprint recognition panel. Light exiting from the fingerprint recognition panel is irradiated on the fingerprint F and reflected by the fingerprint F back into the fingerprint recognition panel. Based on an intensity of light received by the light sensor 220, the fingerprint recognition panel can determine a pattern of the fingerprint F. In an embodiment, each light sensor 220 may be a photosensor.

When the fingerprint F is in contact with the fingerprint recognition panel, ambient light around the fingerprint F may also be incident on the light direction control film 120, and may be incident on a side of the light direction control film 120 due to the blocking of the fingerprint F.

Referring to FIG. 1, in a case where the ambient light (as indicated by the solid arrow in FIG. 1) around the fingerprint is incident on the side of the light direction control film 120, the ambient light first enters the edge region of the light direction control film 120. Since the refractive index of the light direction control film 120 increases from the edge region of the light direction control film 120 to the central region of the light direction control film 120 gradually, the ambient light is irradiated on an interface of regions of the light direction control film 120 having different refractive indexes, and changes its propagation direction. As described above, the refractive index of the central region of the light direction control film 120 is larger than the refractive index of any region on both sides of the central region of the light direction control film 120, and thus the propagation direction of the ambient light is deflected toward the direction perpendicular to the thickness direction of the light direction control film 120. When the propagation direction of the ambient light becomes perpendicular to the thickness direction of the light direction control film 120, even if the ambient light is incident on an interface of regions having different refractive indexes, the ambient light will not changes its propagation direction and continue to propagate along the direction perpendicular to the thickness direction of the light direction control film 120, until it exits from the light direction control film 120. As described above, in a case where the ambient light emitted from the central region having the maximum refractive index of nx does not deflect to the direction perpendicular to the thickness direction of the light direction control film 120, the ambient light may finally exit from the lower portion of another side (e.g., the left side shown in FIG. 1) of the light direction control film 120, thereby reducing or avoiding the ambient light incident on the light sensor 220 located right below the light direction control film 120. Therefore, the interference of the ambient light on fingerprint recognition can be reduced or avoided, so that the fingerprint can be recognized accurately.

When a touch occurs, the fingerprint F is in direct contact with a surface of the light direction control film 120, and thus a propagation direction of light reflected by the fingerprint F is substantially the same as the thickness direction of the light direction control film 120, or there is a small angle therebetween. When the propagation direction of light reflected by the fingerprint F is the same as the thickness direction of the light direction control film 120, the reflected light will pass through the light direction control film 120 without changing its propagation direction, and is incident on the light sensor (or the photosensor) 220 provided under the light direction control film 120. FIG. 2 schematically shows the propagation of light reflected by the fingerprint F in a case where an angel between the propagation direction of the reflected light and the thickness direction (i.e., the vertical direction in FIG. 3) of the light direction control film 120 is relatively small.

Since the angel between the propagation direction of the light reflected by the fingerprint F and the thickness direction of the light direction control film 120 is relatively small, when the light is incident on an interface between two adjacent regions, which have different refractive indexes, of the refractive index gradient regions and the incident angle thereof is greater than or equal to the corresponding critical angle for total internal reflection, total internal reflection will occur. After the light undergoes a plurality of reflections, a direction in which the light exits from the light direction control film 120 may be parallel to a direction of the incident light, and finally the exiting light may be irradiated on the light sensor 220. It can be seen that although the light undergoes a plurality of reflections, the fingerprint information carried in the light may remain unchanged.

Therefore, when the fingerprint recognition panel is used for recognizing a fingerprint, accurate fingerprint information can be obtained while the influence of the ambient light on the fingerprint recognizing process can be reduced or eliminated, thereby increasing the accuracy of the fingerprint recognition.

To further increase the accuracy of the fingerprint recognition, in an embodiment, the orthographic projection of each light sensor 220 on the substrate 200 completely coincides with the orthographic projection of the corresponding light direction control film 120 on the substrate 200.

As an implementation of the present disclosure, the fingerprint recognition panel may have only the function of fingerprint recognition.

As another implementation of the present disclosure, the fingerprint recognition panel may have both a display function and the function of fingerprint recognition. In this implementation, the fingerprint recognition panel includes a plurality of pixel units 210A and a light blocking region 220A surrounding each of the pixel units 210A. In order not to adversely impact an aperture ratio of the fingerprint recognition panel, for example, the light sensor 220 is provided in the light blocking region 220A.

In an embodiment, the fingerprint recognition panel provided by the present disclosure may further include a light uniformly transmissive film 110, and the light uniformly transmissive film 110 and the light direction control film 120 are provided in a same layer. A refractive index of the light uniformly transmissive film 110 is equal to the refractive index of the edge region, which has the minimum refractive index of n1, of the light direction control film 120. The light uniformly transmissive film 110 is provided between any two adjacent light direction control films 120 and above a corresponding pixel unit 210A, so as not to affect the normal display of the pixel unit 210A. In an embodiment, an upper surface of each light uniformly transmissive film 110 is flush with an upper surface of each light direction control film 120, thereby preventing an error of fingerprint recognition due to deformation caused by contact of the fingerprint F with the fingerprint recognition panel.

In the present disclosure, "light exiting from the fingerprint recognition panel" may be implemented in various ways. In an embodiment, each of the pixel units 210A is provided with a light emitting unit 210 therein. Each of the light blocking regions 220A is provided with a pixel define layer 230 therein, and each of the light sensors 220 is provided on one of the pixel define layers 230.

The light emitted by the light emitting unit 210 can not only realize the display function but also be used for recognizing the fingerprint F. When the fingerprint F contacts the surface of the fingerprint recognition panel, the light emitted by the light emitting unit 210 is irradiated on the fingerprint F.

In an embodiment, the light emitting unit 210 is an organic light emitting diode.

It should be understood that the present disclosure is not limited to the foregoing embodiments. For example, the fingerprint recognition panel may be a liquid crystal panel, which may be provided with a backlight. Light emitted from the backlight can be transmitted through pixel units to be irradiated on a fingerprint touching the fingerprint recognition panel.

As shown in FIG. 3, in an embodiment, an encapsulation layer (e.g., a transparent resin layer) 240 may be provided between each light emitting unit 210/each light sensor 220 and each light uniformly transmissive film 110/each light direction control film 120, to encapsulate each light emitting unit 210 and each light sensor 220. In an embodiment, to prevent each light direction control film 120 from being worn, the fingerprint recognition panel further includes a protection layer (e.g., a transparent glass layer) 250 provided on a surface of the light direction control film 120 distal to the substrate 200.

In an embodiment, the protection layer 250 may be made of a polyethylene terephthalate (PET) material.

As shown in FIG. 3, in an embodiment of the present disclosure, each of the pixel units 210A may be provided therein with one light sensor 220, and the light sensor 220 and the light emitting unit 210 in each of the pixel units 210A are provided in a same layer. In this case, each of the pixel define layers 230 is disposed between two adjacent pixel units 210A and has no light sensor 220 provided thereon. In this way, the pixels per inch (PPI) of the fingerprint recognition panel can be increased.

In order to increase the accuracy of fingerprint recognition, in an embodiment, each of the pixel units 210A is provided with one light sensor 220 (i.e., the pixel units 210A and the light sensors 220 are in one-to-one correspondence).

In an embodiment, an area of each light sensor 220 is configured to be the same as an area of the corresponding light emitting unit 210, no matter whether each light sensor 220 is provided within or outside the corresponding pixel unit 210A. The result of simulation shows that, in the case where the area of each light sensor (e.g., each photosensor) 220 is the same as the area of the corresponding light emitting unit (e.g., a corresponding organic light emitting diode) 210, the best effect of fingerprint recognition can be obtained.

Figure 4:
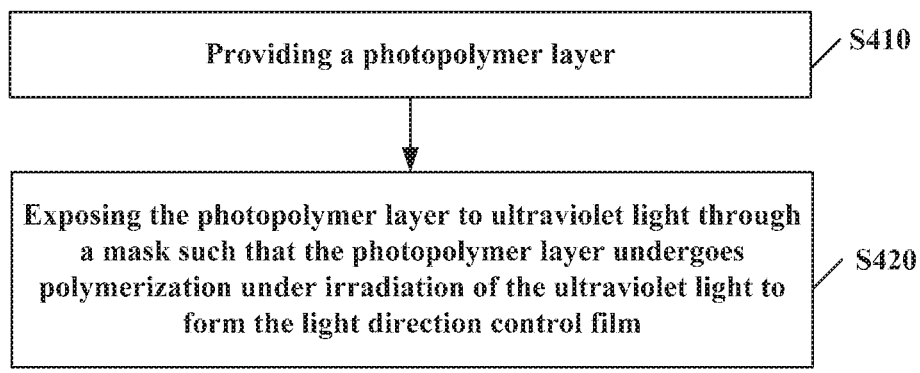
FIG. 4 is a schematic flowchart showing a method for manufacturing a light direction control film according to an embodiment of the present disclosure.
Figure 5:
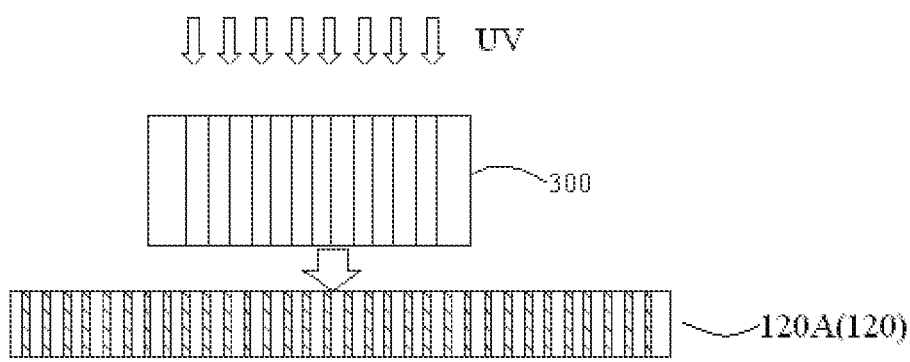
FIG. 5 is a schematic diagram showing an arrangement relationship between a mask and a photopolymer layer (or a light direction control film) according to an embodiment of the present disclosure.

As a third aspect of the present disclosure, there is provided a method for manufacturing a light direction control film, as shown in FIGS. 4 and 5. The method may include the following steps S410 and S420.

Step S410 includes providing a photopolymer layer 120A.

Step S420 includes exposing the photopolymer layer 120A to ultraviolet light UV through a mask (e.g., a graytone mask) 300 such that the photopolymer layer 120A undergoes polymerization under irradiation of the ultraviolet light UV to form the light direction control film 120. The mask 300 has, in a widthwise direction (i.e., the horizontal direction in FIG. 5) thereof, a light transmittance decreasing from each of both sides of the mask 300 to a central region of the mask 300 gradually, such that the light direction control film 120 has, in a direction (i.e., the horizontal direction in FIG. 5) perpendicular to a thickness direction (i.e., the vertical direction in FIG. 5) of the light direction control film 120, a refractive index decreasing from a central region of the light direction control film 120 to each of both sides of the light direction control film 120 gradually. Further, the refractive index of the light direction control film 120 is uniform (or constant or unchanged) in the thickness direction of the light direction control film 120.

For example, similar to that shown in FIG. 1, in the widthwise direction of the mask 300, the mask 300 may include 2×(x−1)+1 light transmissive regions having a same size, and the light transmittances of the 2×(x−1)+1 light-transmissive regions of the mask 300 decrease from each of both sides of the mask 300 to the central regions of the mask 300 gradually, where x is a positive integer greater than 1. The light direction control film 120 provided by the present disclosure may be manufactured by the manufacturing method provided by the present disclosure.

The photopolymer of the photopolymer layer 120A may include a monomer, a photoinitiator, a binder, and a film-forming agent.

The photopolymer is a transparent resin that has a specific color before being exposed to light and can record information about light. Thus, the photopolymer may also be referred to as a holographic recording material. The photopolymer may be transparent or colorless after being exposed to light. A refractive index of a region of the photopolymer layer 120A below a corresponding light-transmissive region of the mask 300 may depend on an amount of exposure (e.g., a value of a light transmittance of the corresponding light-transmissive region of the mask 300).

Photopolymerization is a reaction in which free radicals or ions are generated through a chemical method to cause monomer molecules to undergo polymerization.

A monomer is the main reactant in the photochemical secondary process. Monomers activated by primary active species form monomeric free radicals or ions, and undergo a chain polymerization reaction with other monomers, resulting in growth of different polymer chains.

After absorbing light having a suitable wavelength and a suitable intensity, the photoinitiator undergoes a photophysical process and transitions to an excited state, resulting in primary active species (free radicals or ions).

The role of the binder is mainly to assist in film formation.

When exposing the photopolymer layer 120A, a non-uniform spatial light field is formed by using the mask 300. In a region where the light intensity is relatively large, a speed of photochemical reaction is fast, and the monomer is consumed fast, such that the light direction control film 120 provided by the present disclosure can be formed.

In an embodiment, the photopolymer may include the following components:
the monomer: ranging from 30 wt % to 60 wt %;
the photoinitiator: ranging from 1 wt % to 10 wt %;
the binder: ranging from 1 wt % to 20 wt %; and
the film-forming agent: ranging from 10 wt % to 40 wt %.

In an embodiment, the monomer may be acrylamide, the photoinitiator may be 1-hydroxycyclohexyl phenyl ketone, the binder may be an acrylate, and the film-forming agent may be methyl methacrylate.

As an embodiment of the present disclosure, the light direction control film 120 has a thickness ranging from 1 μm to 100 μm. The light direction control film 120 having a thickness within this range is easily manufactured, and can ensure that the refractive index of the light direction control film 120 in its thickness direction is constant (or uniform).

It can be seen from the foregoing, when the light direction control film provided by the present disclosure is used for recognizing a fingerprint, the adverse influence of the ambient light on a recognition result can be reduced or eliminated, and the mutual interference between light reflected by different portions of the fingerprint can be reduced or eliminated, thereby obtaining a more accurate recognition result. Further, the fingerprint recognition panel according to the present disclosure can recognize a fingerprint more accurately.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A light direction control film, having, in a direction perpendicular to a thickness direction of the light direction control film, a refractive index decreasing from a central region of the light direction control film to each of both sides of the light direction control film gradually, wherein light direction control film comprising a fingerprint recognition panel, further comprising: a substrate; a light sensor provided on the substrate; and the light direction control film; wherein the light sensor is provided between the light direction control film and the substrate, and an orthographic projection of the light sensor on the substrate is located within an orthographic projection of the light direction control film on the substrate, wherein the orthographic projection of the light sensor on the substrate completely coincides with the orthographic projection of the light direction control film on the substrate.

2. The light direction control film according to claim 1, wherein a distribution of the refractive index of the light direction control film is mirror symmetrical with respect to the central region.

3. The light direction control film according to claim 1, wherein the refractive index of the light direction control film is uniform in the thickness direction of the light direction control film.

4. The light direction control film according to claim 1, wherein the light direction control film has a width ranging from 1 μm to 100 μm.

5. The light direction control film according to claim 1, wherein the light direction control film is made of a photopolymer.

6. The light direction control film according to claim 1, further comprising a plurality of pixel units and a light blocking region surrounding each of the plurality of pixel units, wherein the light sensor is provided in the light blocking region.

7. The light direction control film according to claim 6, wherein each of the plurality of pixel units is provided therein with a light emitting unit, a pixel define layer is provided in the light blocking region, and the light sensor is provided on the pixel define layer.

8. The light direction control film according to claim 7, wherein the light emitting unit is an organic light emitting diode.

9. The light direction control film according to claim 7, wherein an area of the light sensor is configured to be equal to an area of the light emitting unit corresponding to the light sensor.

10. The light direction control film according to claim 1, further comprising a protection layer provided on a surface of the light direction control film distal to the substrate.

11. The light direction control film according to claim 1, further comprising a plurality of pixel units, wherein each of the plurality of pixel units is provided therein with a light emitting unit and a light sensor, and the light sensor and the light emitting unit in each of the plurality of pixel units are provided in a same layer.

12. The light direction control film according to claim 11, wherein the light sensor and the light emitting unit in each of the plurality of pixel units are configured to have a same area.

13. The light direction control film according to claim 1, further comprising a light uniformly transmissive film, wherein the light uniformly transmissive film and the light direction control film are provided in a same layer.

14. The light direction control film according to claim 13, wherein the light uniformly transmissive film has a refractive index equal to a refractive index of an edge region, which has a minimum refractive index, of the light direction control film.

15. The light direction control film according to claim 14, wherein an upper surface of the light uniformly transmissive film is flush with an upper surface of the light direction control film.

* * * * *